United States Patent [19]

Kennedy et al.

[11] Patent Number: 4,972,446
[45] Date of Patent: Nov. 20, 1990

[54] VOLTAGE CONTROLLED OSCILLATOR USING DUAL MODULUS DIVIDER

[75] Inventors: Richard A. Kennedy, Russiaville; Gregory J. Manlove; Jeffrey J. Marrah, both of Kokomo, all of Ind.

[73] Assignee: Delco Electronics Corporation, Kokomo, Ind.

[21] Appl. No.: 393,498

[22] Filed: Aug. 14, 1989

[51] Int. Cl.$^5$ .................... H03L 7/193; H03K 21/02
[52] U.S. Cl. .......................... 377/47; 377/55; 377/50; 377/52; 328/155; 331/1 A; 307/271
[58] Field of Search ............ 377/47, 48, 50, 55, 377/52; 328/155; 331/1 A; 307/271

[56] References Cited

U.S. PATENT DOCUMENTS

| | | | |
|---|---|---|---|
| 4,101,838 | 7/1978 | Aihara et al. | 377/50 |
| 4,352,010 | 9/1982 | Koogler | 377/50 |
| 4,423,381 | 12/1983 | Stepp et al. | 377/48 |
| 4,573,175 | 2/1986 | Cressey et al. | 377/50 |
| 4,577,163 | 3/1986 | Culp | 331/1 A |
| 4,633,194 | 12/1986 | Kikuchi et al. | 377/47 |
| 4,712,224 | 12/1987 | Nelson | 377/47 |
| 4,856,032 | 8/1989 | Klekotka et al. | 377/47 |
| 4,896,337 | 1/1990 | Bushy | 328/155 |

Primary Examiner—John S. Heyman
Attorney, Agent, or Firm—Albert F. Duke

[57] ABSTRACT

An analog/digital voltage controlled oscillator includes a voltage to pulse converter which responds to a control voltage to generate appropriate control pulses to change the mode of operation of a divider to thereby vary the output frequency of the oscillator.

5 Claims, 4 Drawing Sheets

VOLTAGE CONTROLLED OSCILLATOR USING DUAL MODULUS DIVIDER

FIELD OF THE INVENTION

This invention relates to digital voltage controlled oscillators (VCO) and more particularly to a VCO which is included in an analog/digital phase locked loop (PLL) such as disclosed in patent application G-1804 which is incorporated herein. Such a PLL may be advantageously employed in a FM stereo decoder.

BACKGROUND OF THE INVENTION

There are a number of standard voltage controlled oscillators, analog and digital, that have been used in a variety of applications.

FIG. 1 shows a typical continuous time analog VCO. The circuit is made up of two variable current sources I1 and I2, a capacitor C which functions as a storage element, and a comparator with hysteresis such as a Schmitt trigger 10. The capacitor C is charged from the current source I1 until it exceeds the high trip voltage, Vhigh of the Schmitt trigger 10. When Vhigh is reached, the capacitor is switched to I2 and discharged until the low trip voltage, Vlow of the Schmitt trigger is reached at which time the capacitor is again charged from the current source, I1, and the process repeats. Assuming I2=I1, the frequency of the oscillation F equals:

$$F = 0.5 * I1 / [C1 * (Vhigh - Vlow)]$$

From the equation, the frequency of the oscillator is directly dependent on the variable current source, I1. Because the current source is varied by a voltage, Vcontrol, the oscillator frequency is also controlled by this voltage, hence the designation voltage controlled oscillator. The absolute value of the current source is usually dependent on a resistor; therefore, the accuracy of the frequency of the VCO is dependent on a RC product. The absolute accuracy of integrated resistors and capacitors is very poor so external components are required. Accurate external components are expensive and temperature dependent which limit absolute accuracy over temperature and time to approximately 2 percent. This basic circuit approach is therefore unacceptable for applications where greater accuracy is required.

Another type of VCO is one comprised of switched capacitor circuits. It is similar to the linear VCO previously described except the current source and capacitor are replaced by a switched capacitor integrator with discrete time updates. This circuit has continuous voltage output, but it has a discrete time output. A typical circuit is shown in FIG. 2. Vcontrol is applied to a switched capacitor integrator generally designated 12 having a time constant which is determined by the ratio of CA to CB and the input clock rate. The value of Vcontrol determines the time it takes for the integrator to ramp to a known voltage, Vhigh or Vlow in the Schmitt trigger 14. Input clock phasing, determined by the state of the switches S5-S8, controls whether the integrator has a positive or negative gain. In one state $\phi 1$ is applied to S1 and $\phi 2$ is applied to S2. In the other state $\phi 2$ is applied to S1 and $\phi 1$ is applied to S2. When the integrator toggles the Schmitt trigger 14, the input phasing is switched. This causes the integrator to ramp toward the other trip point where the process repeats itself. Thus, an oscillator is created whose frequency is directly dependent on the input control voltage.

The accuracy of this circuit is dependent on how accurately the capacitors CA and CB are matched and the accuracy of the clock. The clock is established by an external crystal and is not the main source of error. The capacitor matching ratio is limited to approximately 0.1 percent, if the capacitor ratios are within a factor of 10. The SC VCO's output frequency is theoretically perfect because the integrator has no voltage quantization; however, there is a maximum phase error due to the discrete time nature of the circuit. The phase error can be minimized by having a large number of steps in the ramp voltage. This can only be achieved with a ratio of CA to CB which is very large. The greater the mismatch in size of CA and CB, the less the overall accuracy of the oscillator. In a practical circuit, the desired maximum phase error would require an unreasonably large capacitor ratio which would limit the accuracy to approximately 0.3 percent or greater and be very area inefficient.

Another type of VCO is fully digital. In patent No. 4,577,163, for example, a digital PLL with a DCO is presented. In this circuit, the output frequency is controlled by an input bit pattern. The input bit pattern directly affects the value of the frequency. The circuitry is both discrete in time and in magnitude (a finite word length takes the place of the input control voltage). This has the problem of phase error and center frequency accuracy The phase error is a fundamental limitation in a discrete time system. This can be minimized in a digital system by making the clock to center frequency ratio high. It is fully digital, so the capacitor ratio problem of the SC VCO is eliminated, and digital circuitry requires a relatively small area. In this circuit the output frequency is controlled by a finite input word length. This will cause the center frequency to vary over time. This inaccuracy is unacceptable in some applications.

SUMMARY OF THE INVENTION

With the foregoing in mind it is an object of the present invention to provide a fully integrated voltage controlled oscillator (VCO) with an extremely accurate free running frequency.

It is another object of the present invention to provide a VCO with a perfect frequency response on the average, and a small maximum phase error.

SUMMARY OF THE INVENTION

The VCO of the present invention is a combined digital and analog circuit used in the phase lock loop (PLL) of a FM stereo decoder. Its center frequency is referenced to an external squarewave signal which is generated with a crystal oscillator. Most PLL's use analog VCO's which require expensive and relatively inaccurate external components and/or time consuming external adjustments. The use of these components force the designer to widen the bandwidth of the PLL, thereby reducing system performance. By using a VCO whose center frequency is referenced to a crystal, it is possible to have a very high performance system without the use of any external parts.

BRIEF DESCRIPTION OF THE DRAWINGS

The above and other advantages of the invention will become more apparent from the following description taken in conjunction with the accompanying drawings wherein like references refer to like parts and wherein.

DETAILED DESCRIPTION

Figure 1:
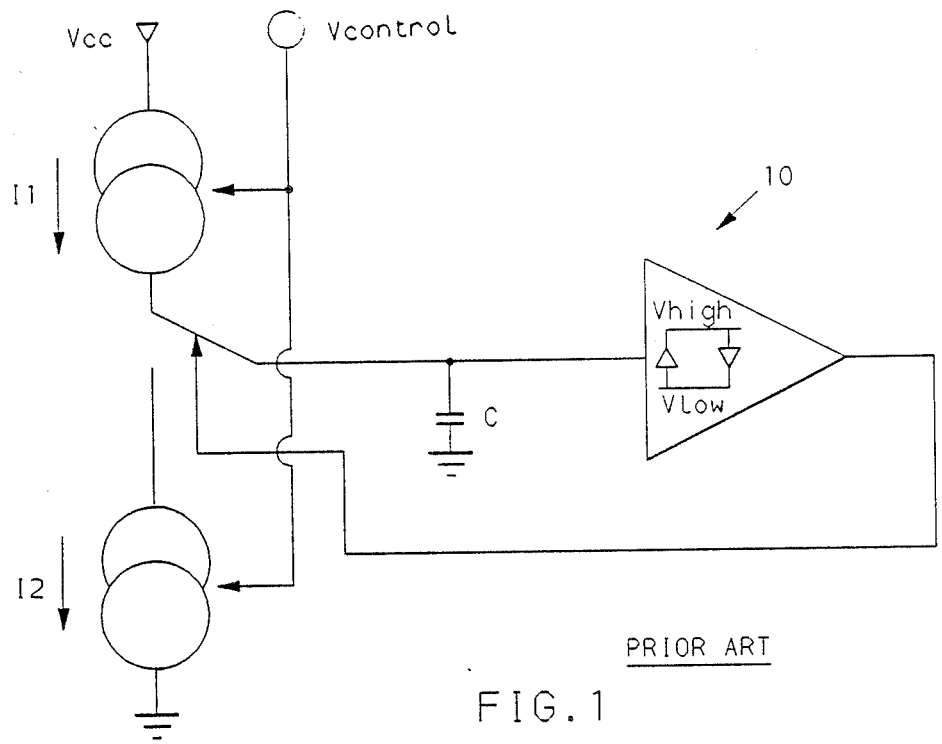
FIG. 1 is a prior art continuous time analog VCO.
Figure 2:
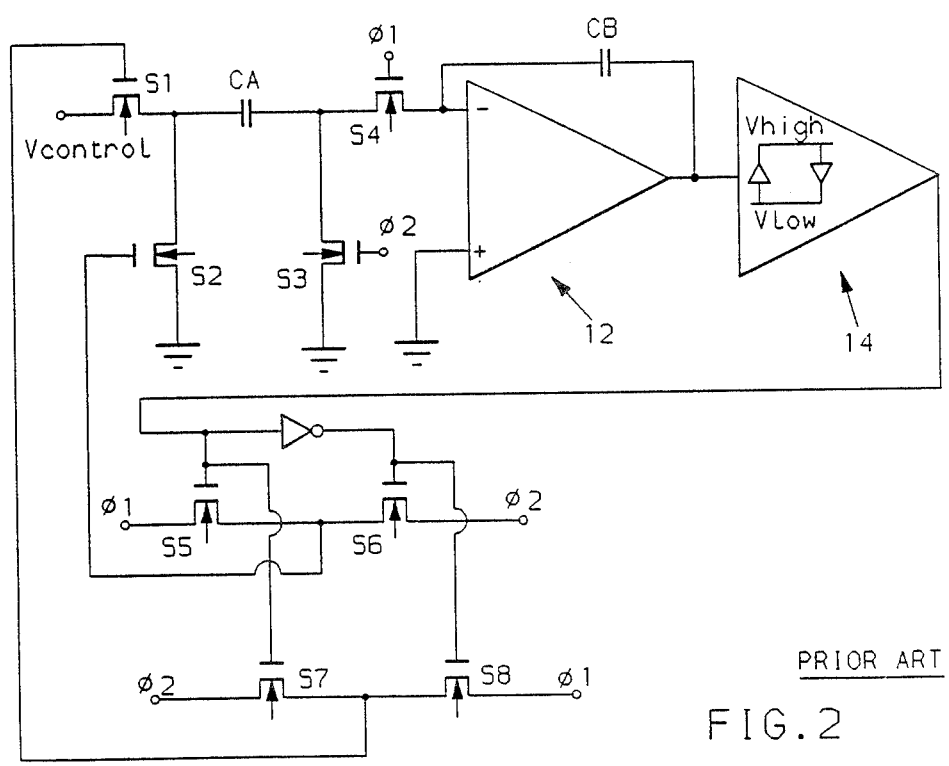
FIG. 2 is a prior art switched capacitor VCO.
Figure 3:
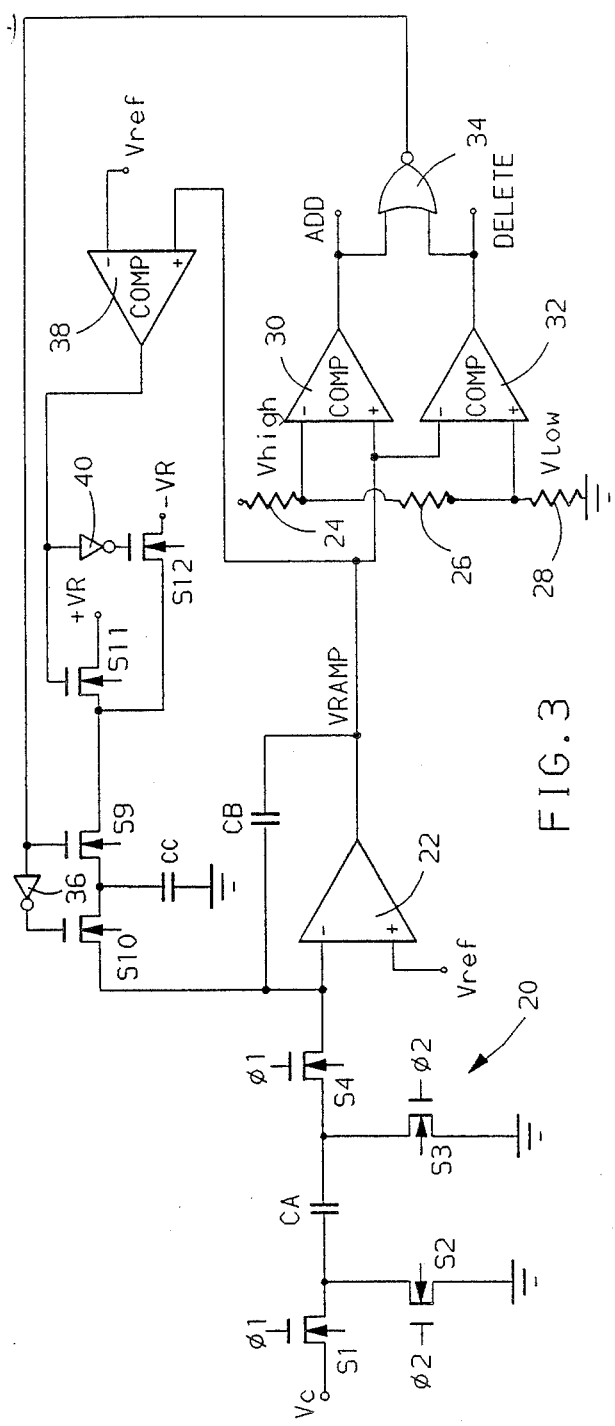
FIG. 3 is the analog stage of the combined analog and digital VCO of the present invention.

The combined analog and digital VCO of the present invention is comprised of two basic sections. The first section is a voltage to pulse converter as shown in FIG. 3. The switched capacitor integrator 20 operates similar to that shown in FIG. 2 but there is no polarity switching. If Vc is greater in amplitude than Vref, the output of the operational amplifier 22 (VRAMP) integrates toward ground. CA in conjunction with switches S1-S4 act as an equivalent resistor, which combines with CB and amplifier 22 to form an integrator. A voltage divider formed by resistors 24,26,28 establish reference inputs Vhigh to the negative input of comparator 30 and Vlow to the positive input of comparator 32. The outputs of comparators 30 and 32 designated ADD and DELETE respectively are applied as inputs to a NOR gate 34 the output of which is applied to switch S9 and though inverter 36 to switch S10 to control capacitor CC. A voltage +VR is applied to S9 through switch S11 or a voltage −VR is applied to S9 thought switch S12 under the control of comparator 38 which responds to the VRAMP output of amplifier 22. The output of comparator 38 is connected directly to S11 and through inverter 40 to S12. When VRAMP goes below Vlow, the DELETE signal goes high and switches S10 on. When switch S10 conducts the ramp is then reset by taking a fixed charge off the capacitor CB equal to CC times VR. When the ramp resets, the DELETE signal goes low and the process continues with VRAMP integrating towards ground. This allows the output to be fully continuous in voltage; thereby allowing the output frequency to be exact on the average.

If Vc is lower in amplitude than Vref, the output of the opamp (VRAMP) integrates toward supply. When VRAMP goes above Vhigh, the ADD signal goes high and the switch S9 is turned on and the switch S10 is turned off. The ramp is then reset by taking a fixed charge off the capacitor CB equal to CC times −VR. When the ramp resets, the ADD signal goes low and the process continues with VRAMP integrating towards supply. The RC time constant of the integrator and the difference in amplitude between Vc and Vref determine the average rate of DELETE or ADD pulses. The integrator averages out small perturbations on the Vc line which makes the circuit less sensitive to noise. Unlike the SC VCO, the SC integrator merely controls the gain of the analog/digital VCO, not the free running frequency. Gain is not as important a parameter in the operation of the PLL, and any small gain inaccuracy in this circuit does not limit the PLL system performance.

Figure 4:
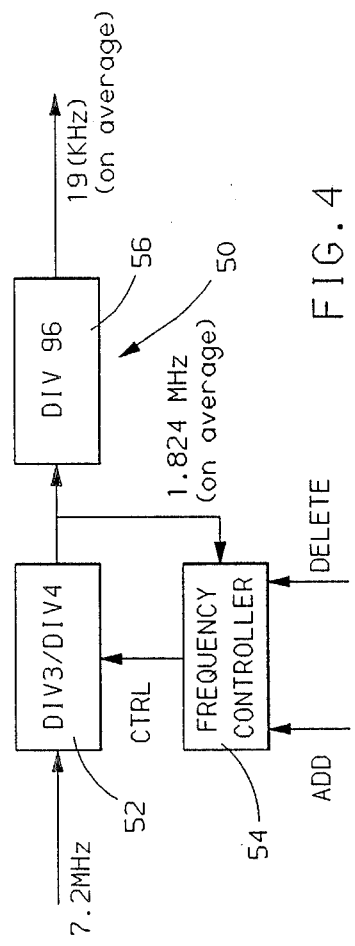
FIG. 4 is a block diagram of the digital stage of the combined analog and digital VCO of the present invention.

Referring now to FIG. 4, the second section of the analog/digital VCO is a digital divider generally designated 50 which produces (on average) a 19 kHz output based on a 7.2 MHz reference signal This reference signal is a doubled version of a 3.6 MHz clock crystal reference. The divider 50 comprises a jitter divider, 52 which divides the 7.2 MHz input by a factor of 3 or a factor of 4 under the control of frequency controller 54. The controller 54 responds to the ADD and DELETE pulses of the circuit of FIG. 3 and provides a CTRL signal for placing the divider 52 in a divide by 3 or a divide by 4 mode. In the absence of ADD or DELETE pulses the controller 54 provides for one divide by 3 followed by twenty four divide by 4 operations. This provides an output which is 1.824 MHz on the average Divider 56 divides this signal by 96 to generate the desired 19 kHz output. Because the frequency of the crystal reference is accurate to within 0.01%, the 19 kHz output is accurate to within 1.9 Hz. The digital divider normally runs with the ratio of divide by three's and divide by four's as indicated above. An ADD or DELETE pulse either adds an extra divide by 3 or deletes a standard divide by 3 operation. This results in an slight change in the output frequency from the divider 56.

Figure 5:
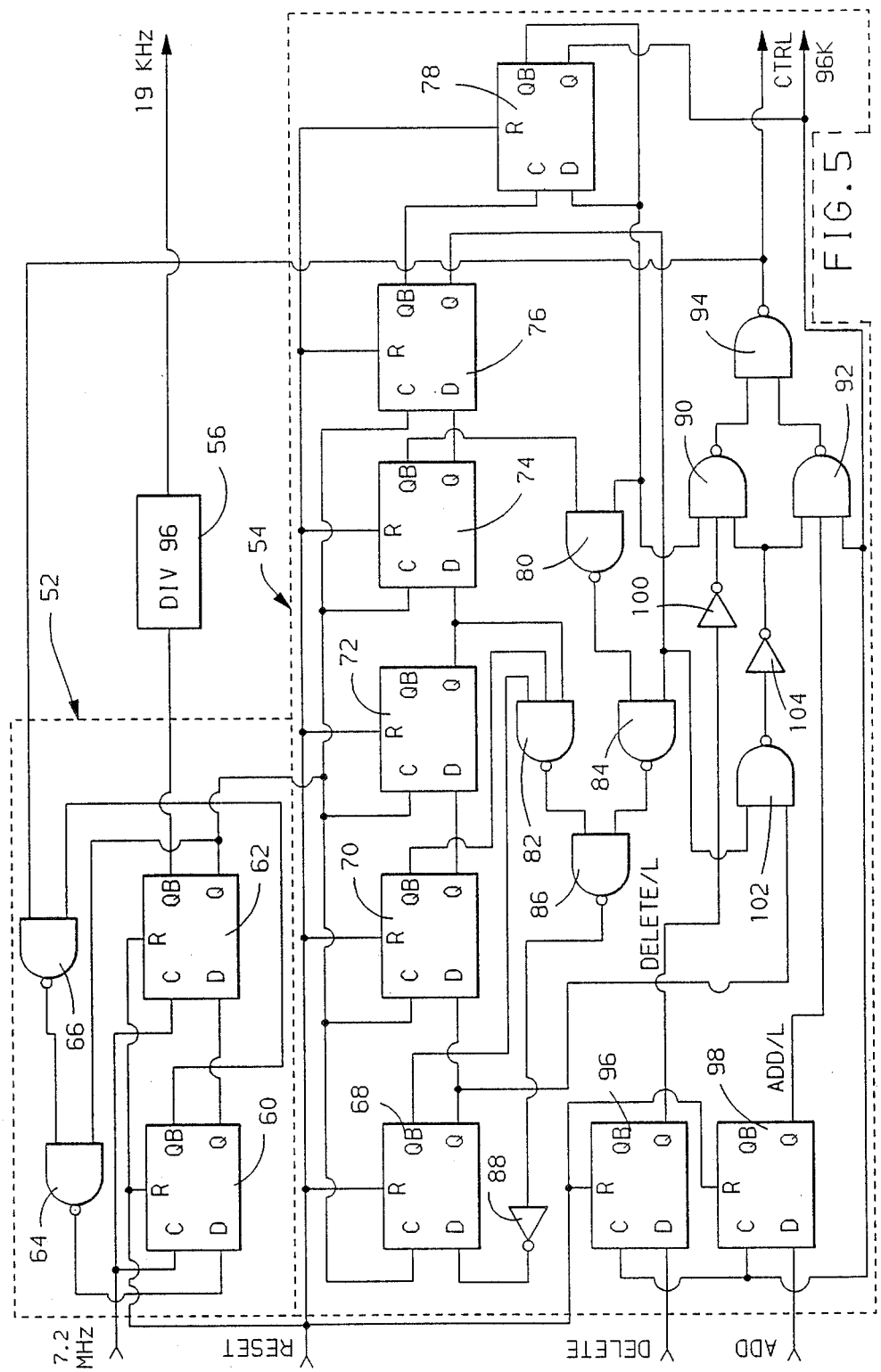
FIG. 5 is a more detailed logic diagram of the block diagram of FIG. 4.
Figure 6A:
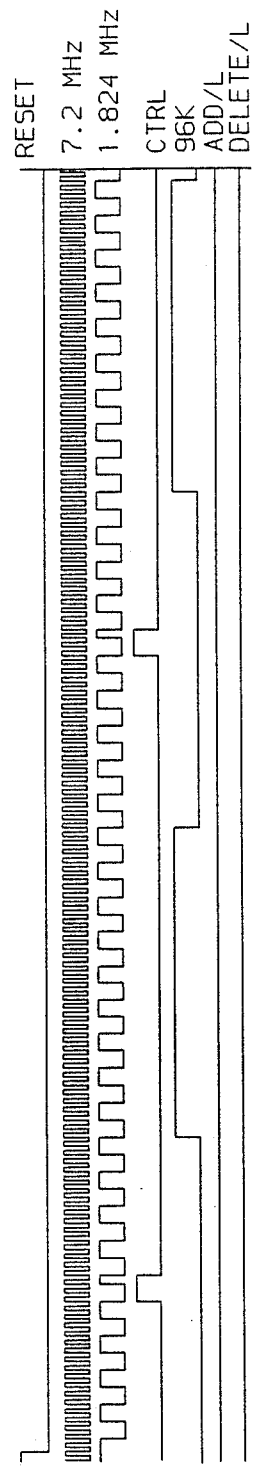
FIGS. 6a-6c are waveforms useful in explaining the operation of the VCO of the present invention.
Figure 6B:
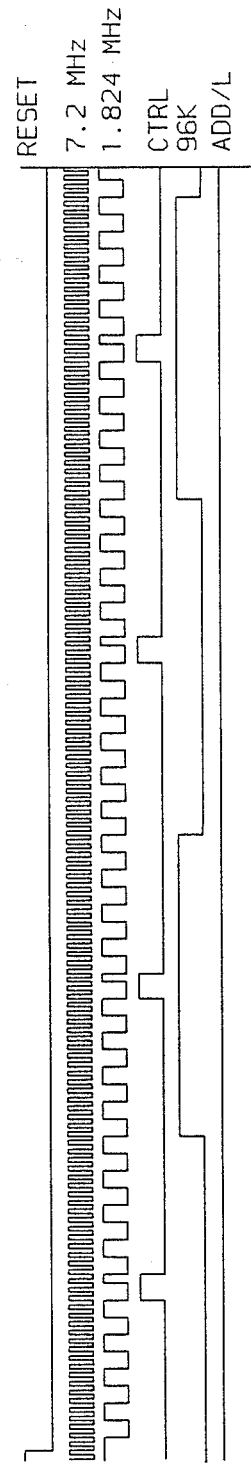
Figure 6C:
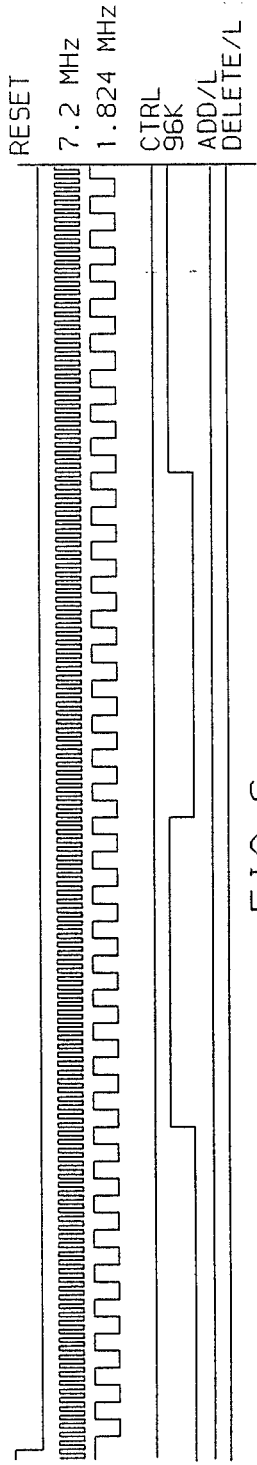

The circuitry of FIG. 4 is shown in greater detail in FIG. 5 and will be further explained with reference to FIGS. 6a-6c. The divider 52 comprises D-type flip flops 60 and 62 and Nand gates 64 and 66. Gate 66 is enabled by the CTRL signal going high, and places the divider 52 in the divide by 3 mode. The output of the divider 52 provides the clock for five D-Type flip flops 68-76 and a T-Type flip flop 78. The flip flops 68-74 are interconnected by Nand gates 80-86 and inverter 88 to produce a 96 kHz signal at the output of the flip flop 78. The 96 kHz signal alternately enables Nand gates 90 and 92 which provide inputs to Nand gate 94 which provides the CTRL output to the divider 52. The ADD and DELETE pulses of FIG. 3 are latched by flip flops 96 and 98 which are clocked from the 96 kHz signal and produce signals ADD/L and DELETE/L as shown in FIGS. 6a-6c. When there are no ADD or DELETE pulses, as in FIG. 6a, the gate 92 is disabled. The gate 90 is enable through inverter 100 during the time when the 96 kHz signal is low, i.e. when QB of flip flop 78 is high. The third input to gates 90 and 92 is from the flip flop 68 and 76 through Nand gate 102 and inverter 104 and positions the rising edge of the CTRL pulses In FIG. 6a, both ADD/L and DELETE/L are low. Under this circumstance the jitter divider produces its normal 1.824 MHz output, providing the 19 KHz output from divider 56. It will be noted that a single CTRL pulse occurs each cycle of the 96 K signal, or each 75 cycles of the 7.2 MHz input. When CTRL is high a divide by 3 operation is performed during 3 of the 75 cycles. During the remaining 72 cycles the divider 52 operates as a divide by 4.

In FIG. 6b ADD/L is high. This enables gate 92 when the 96 K signal is high and forces the output of gate 94 high when the Q output of flip flops 68 and 76 L are high. This adds an extra divide by 3 operation, so that two divide by 3 operations occur during 75 cycles of the 7.2 MHz input. This extra divide by three occurs in place of a divide by 4 operation and increases the output frequency to its highest possible value of 1.82508 MHz, producing 19.0112 kHz at the output of the divider 56.

In FIG. 6c DELETE/L is high and disables the gate 90. This deletes the normal divide by 3 operation as long as DELETE remains high and decreases the output frequency to its lowest possible value of 1.82292 Mhz, producing 18.9888 kHz at the output of divider 56.

The ADD and DELETE pulses are in general never continuously high. Instead they are pulsed high to make small changes in the output frequency of the VCO. The average number of ADD or DELETE pulses, per unit time, affect the output frequency and are directly dependent on the input voltage Vc. The integrator time constant determines the gain of the system and a relatively large inaccuracy in the gain of the system has only a small effect on the performance of the PLL.

This circuit provides an accurate center frequency without the use of external components, and the phase error is minimized by having a large input to output clock ratio and fixed charge reset.

The embodiments of the invention in which an exclusive property or privilege is claimed are defined as follows:

1. A voltage controlled oscillator comprising voltage to pulse converter means responsive to a control voltage for producing first and second control signals when said control voltage is respectively less than or greater than a predetermined reference voltage,
    divider means responsive to an input signal of predetermined frequency and selectively operable to divide the input signal by a divisor x or a divisor y,
    frequency control means for establishing a mode of operation of said divider means in the absence of said first or second control signals which produces a desired output frequency by performing a predetermined sequence of divide by x and divide y operations,
    said frequency control means responsive to said first or second control signal for altering said sequence and thereby varying said output frequency.

2. A voltage controlled oscillator comprising voltage to pulse converter means responsive to a dc control voltage for producing ADD and DELETE control pulse signals when said control voltage is respectively less than or greater than a predetermined reference voltage,
    divider means responsive to an input signal of predetermined frequency and selectively operable to divide the input signal by a divisor N or a divisor N+1,
    frequency control means for establishing a mode of operation of said divider means in the absence of said ADD or DELETE control signals which produces a . desired output frequency by performing a predetermined sequence of divide by N and divide N+1 operations,
    said frequency control means responsive to said ADD or DELETE control signal for respectively adding or deleting at least one of said divide by N operations to thereby vary said output frequency.

3. A voltage controlled oscillator comprising voltage to pulse converter means responsive to a dc control voltage for producing ADD and DELETE pulse signals when said control voltage is respectively less than or greater than a predetermined reference voltage,
    divider means responsive to an input signal of predetermined frequency and selectively operable to divide the input signal by a divisor N in response to a CTRL signal or a divisor N+1 in the absence of a CTRL signal,
    frequency control means for producing said CTRL signal and for establishing a mode of operation of said divider means in the absence of said ADD or DELETE pulse signals which produces a desired output frequency by generating a CTRL signal which dictates a predetermined sequence of divide by N and divide N+1 operations,
    said frequency control means responsive to said ADD or DELETE control signal for modifying said CTRL signal to respectively replacing at least one of said divide by N+1 operations with a divide by N operation or replacing at least one of said divide by N operation with a divide by N+1 operation to thereby vary said output frequency.

4. The invention defined in claim 3 wherein said voltage to pulse converter comprising a switched capacitor integrator producing a ramp output of negative or position direction depending upon whether said dc control voltage is greater than or less than said predetermined reference voltage, window detector means producing said ADD pulses when said ramp output exceed a Vhigh reference and producing said DELETE pulses when said ramp output goes below a Vlow reference, means responsive to ADD or DELETE pulses for resetting said ramp output with a fixed charge.

5. The invention defined by claim 4 wherein N is an integer and said predetermined sequence produces a non-integer division of said input signal.

* * * * *